United States Patent
Zhou et al.

(10) Patent No.: US 11,222,904 B2
(45) Date of Patent: Jan. 11, 2022

(54) THIN FILM TRANSISTOR AND MANUFACTURING METHOD THEREOF, ARRAY SUBSTRATE AND MANUFACTURING METHOD THEREOF, AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Hongru Zhou, Beijing (CN); Zhonghao Huang, Beijing (CN); Xu Wu, Beijing (CN); Chao Zhang, Beijing (CN); Kai Wang, Beijing (CN)

(73) Assignees: CHONGQING BOE OPTOELECTRONICS TECHNOLOGY CO., LTD., Chongqing (CN); BOE TECHNOLOGY GROUP CO., LTD, Beijing (CN)

( * ) Notice: Subject to any disclaimer, the term of this patent is extended or adjusted under 35 U.S.C. 154(b) by 167 days.

(21) Appl. No.: 16/633,637

(22) PCT Filed: Jan. 7, 2019

(86) PCT No.: PCT/CN2019/070702
§ 371 (c)(1),
(2) Date: Jan. 24, 2020

(87) PCT Pub. No.: WO2020/142881
PCT Pub. Date: Jul. 16, 2020

(65) Prior Publication Data
US 2021/0074735 A1    Mar. 11, 2021

(51) Int. Cl.
*H01L 27/12* (2006.01)
*H01L 27/32* (2006.01)
(Continued)

(52) U.S. Cl.
CPC ...... *H01L 27/1218* (2013.01); *H01L 27/1262* (2013.01); *H01L 27/3272* (2013.01); *H01L 27/1214* (2013.01); *H01L 27/1259* (2013.01)

(58) Field of Classification Search
CPC ............ H01L 27/1214; H01L 27/1218; H01L 27/1262; H01L 27/1259; H01L 27/3272
See application file for complete search history.

(56) References Cited

U.S. PATENT DOCUMENTS 9,373,670 B2   6/2016 Tae
10,373,986 B2 * 8/2019 Lai ...................... H01L 27/1248
(Continued)

FOREIGN PATENT DOCUMENTS

| CN | 106024909 A | 10/2016 |
|---|---|---|
| CN | 107170829 A | 9/2017 |
| CN | 107425074 A | 12/2017 |

*Primary Examiner* — Mohsen Ahmadi
(74) *Attorney, Agent, or Firm* — Dilworth & Barrese, LLP; Michael J. Musella, Esq.

(57) ABSTRACT

A thin film transistor and a manufacturing method thereof, an array substrate and a manufacturing method thereof, and a display device are provided. The thin film transistor is provided on a base substrate and includes: an active layer including a first surface and a second surface which are opposite to each other, in which the second surface is closer to the base substrate than the first surface; and a source-drain electrode layer including a source electrode and a drain electrode which are separated from each other and are respectively connected with the active layer; each of the first surface and the second surface is a non-flat surface, and the non-flat surface includes a plurality of depressions and a plurality of protrusions which are alternately arranged.

14 Claims, 6 Drawing Sheets

(51) Int. Cl.
   *H01L 29/06* (2006.01)
   *H01L 29/417* (2006.01)
   *H01L 29/423* (2006.01)

(56) References Cited

U.S. PATENT DOCUMENTS

| | | | |
|---|---|---|---|
| 10,566,461 B2 | 2/2020 | An et al. | |
| 10,606,388 B2* | 3/2020 | Shi | G06F 3/04164 |
| 10,615,182 B2* | 4/2020 | Zhou | H01L 27/1288 |
| 2017/0052418 A1* | 2/2017 | Zhang | H01L 27/1285 |
| 2017/0186879 A1* | 6/2017 | Sun | H01L 27/1251 |
| 2018/0203313 A1* | 7/2018 | Wang | G02F 1/136286 |
| 2019/0207037 A1 | 7/2019 | Wang et al. | |
| 2019/0243497 A1* | 8/2019 | Zhang | H01L 27/1233 |

* cited by examiner

THIN FILM TRANSISTOR AND MANUFACTURING METHOD THEREOF, ARRAY SUBSTRATE AND MANUFACTURING METHOD THEREOF, AND DISPLAY DEVICE

TECHNICAL FIELD

At least one embodiment of the present disclosure relates to a thin film transistor and a manufacturing method thereof, an array substrate and a manufacturing method thereof, and a display device.

BACKGROUND

With development of display technology, liquid crystal display (LCD) devices and organic light-emitting diode (OLED) display devices have become a mainstream of display devices.

SUMMARY

At least one embodiment of the present disclosure relates to a thin film transistor and a manufacturing method thereof, an array substrate and a manufacturing method thereof, and a display device.

At least one embodiment of the present disclosure provides a thin film transistor, the thin film transistor is on a base substrate and comprises: an active layer comprising a first surface and a second surface which are opposite to each other, in which the second surface is closer to the base substrate than the first surface; and a source-drain electrode layer comprising a source electrode and a drain electrode which are separated from each other and are respectively connected with the active layer; each of the first surface and the second surface is a non-flat surface, and the non-flat surface comprises a plurality of depressions and a plurality of protrusions which are alternately arranged.

In some embodiments of the present disclosure, surfaces, close to the base substrate, of the plurality of depressions of the first surface are in a same plane; and surfaces, away from the base substrate, of the plurality of protrusions of the first surface are in a same plane.

In some embodiments of the present disclosure, the source-drain electrode layer is at a side, away from the base substrate, of the active layer, and the source electrode and the drain electrode are respectively in contact with the first surface.

In some embodiments of the present disclosure, the active layer further comprises a first side surface and a second side surface which are opposite to each other, the source electrode is in contact with the first side surface, the drain electrode is in contact with the second side surface, and the first surface is connected with each of the first side surface and the second side surface.

In some embodiments of the present disclosure, the plurality of depressions of the first surface comprise a first depression and a second depression, the source electrode fills the first depression, and the drain electrode fills the second depression.

In some embodiments of the present disclosure, the thin film transistor further comprises a first insulation layer at a side, away from the base substrate, of the source-drain electrode layer, in which the plurality of depressions of the first surface further comprise a third depression, and the third depression is filled with the first insulation layer.

In some embodiments of the present disclosure, at least one selected from a group consisting of the first depression, the second depression and the third depression comprises a groove having a rectangular, approximately rectangular, trapezoidal, or approximately trapezoidal cross section.

In some embodiments of the present disclosure, the thin film transistor further comprises a light shielding layer; the light shielding layer is at a side, close to the base substrate, of the active layer; the light shielding layer is configured to partially reflect or totally reflect light irradiated to the light shielding layer; and a surface, away from the base substrate, of the light shielding layer comprises a plurality of concave portions and a plurality of convex portions which are alternately arranged.

In some embodiments of the present disclosure, orthographic projections of the plurality of depressions of the first surface on the base substrate respectively coincide with orthographic projections of the plurality of concave portions on the base substrate.

In some embodiments of the present disclosure, orthographic projections of the plurality of protrusions of the first surface on the base substrate respectively coincide with orthographic projections of the plurality of convex portions on the base substrate.

In some embodiments of the present disclosure, the light shielding layer is made of an insulation material, and the light shielding layer is in contact with the active layer.

In some embodiments of the present disclosure, the light shielding layer comprises a third side surface and a fourth side surface which are opposite to each other, the source electrode is in contact with the third side surface, and the drain electrode is in contact with the fourth side surface.

In some embodiments of the present disclosure, a material of the light shielding layer comprises at least one selected from a group consisting of an insulation metal oxide or a silicon-based composite insulation film.

In some embodiments of the present disclosure, the thin film transistor further comprises a gate electrode, in which the gate electrode is at a side, away from the active layer, of the source-drain electrode layer; the gate electrode and the source electrode are insulated from each other, and the gate electrode and the drain electrode are insulated from each other.

In some embodiments of the present disclosure, the light shielding layer is conductive, the light shielding layer further serves as a gate electrode of the thin film transistor, a gate insulation layer is between the light shielding layer and the active layer, and a portion, directly over the light shielding layer, of the gate insulation layer is conformal with the light shielding layer.

At least one embodiment of the present disclosure further provides an array substrate comprising any one of the above-mentioned thin film transistors.

At least one embodiment of the present disclosure further provides a display device comprising the above-mentioned array substrate.

At least one embodiment of the present disclosure further provides a manufacturing method of a thin film transistor, the thin film transistor is formed on a base substrate, and the method comprises: forming an active layer comprising a first surface and a second surface which are opposite to each other, in which the second surface is closer to the base substrate than the first surface, each of the first surface and the second surface is a non-flat surface, and the non-flat surface comprises a plurality of depressions and a plurality of protrusions which are alternately arranged; and forming a source-drain electrode layer comprising a source electrode and a drain electrode which are separated from each other and are respectively connected with the active layer.

In some embodiments of the present disclosure, the method further comprises: forming a light shielding layer on the base substrate before forming the active layer; a surface, away from the base substrate, of the light shielding layer comprises a plurality of concave portions and a plurality of convex portions which are alternately arranged, and the active layer is conformally formed on the light shielding layer.

In some embodiments of the present disclosure, the forming the light shielding layer and the forming the active layer comprise: forming a first light shielding film on the base substrate; patterning the first light shielding film to remove portions of the first light shielding film at intervals to form a second light shielding film; conformally forming an active film on the second light shielding film; and patterning the active film and the second light shielding film by one patterning process to form the light shielding layer and the active layer which have a same pattern.

In some embodiments of the present disclosure, the forming the light shielding layer and the forming the active layer comprise: forming a light shielding film on the base substrate; patterning the light shielding film to form the light shielding layer; conformally forming an active film on the light shielding layer; and patterning the active film to form the light shielding layer and the active layer.

In some embodiments of the present disclosure, the source-drain electrode layer is formed at a side, away from the base substrate, of the active layer; the source electrode and the drain electrode are respectively in contact with the first surface.

At least one embodiment of the present disclosure further provides a manufacturing method of an array substrate, the method comprises any one of the above-mentioned manufacturing methods of the thin film transistor.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In a display device, a thin film transistor (TFT) occupies a small area so as to improve a pixel aperture ratio. In a TFT, because an area of an active layer is small, a heat dissipation area of the active layer is small in a driving process of the TFT, which is easy to cause thermal deformation, resulting in lower electron mobility and weaker driving force of the TFT.

Figure 1:
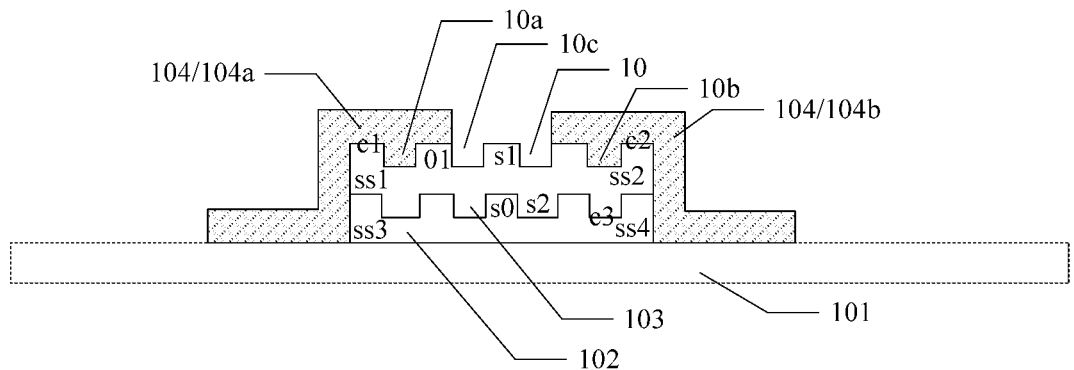
FIG. 1 is a cross-sectional view of a thin film transistor provided by at least one embodiment of the present disclosure.

FIG. 1 is a cross-sectional view of a thin film transistor provided by at least one embodiment of the present disclosure. The thin film transistor is on a base substrate 101 and includes an active layer 103 and a source-drain electrode layer 104. The active layer 103 is on the base substrate 101. The active layer 103 includes a first surface s1 and a second surface s2 which are opposite to each other, and the second surface s2 is closer to the base substrate 101 than the first surface s1. The source-drain electrode layer 104 is at a side, away from the base substrate 101, of the active layer 103, and the source-drain electrode layer 104 includes a source electrode 104a and a drain electrode 104b which are separated from each other. The source electrode 104a and the drain electrode 104b are respectively connected to the active layer 103. Each of the first surface s1 and the second surface s2 is a non-flat surface. The non-flat surface includes a plurality of depressions and a plurality of protrusions which are alternately arranged.

In at least one embodiment of the present disclosure, the active layer 103 is a semiconductor layer, and a material of the active layer 103 includes oxide semiconductor material, amorphous silicon, polysilicon, a-Si and other semiconductor materials, etc. For example, the oxide semiconductor material includes, but is not limited to, indium gallium zinc oxide (IGZO).

For example, the base substrate 101 is a transparent glass substrate, but is not limited to this, and may be selected as required.

On one hand, in a driving process of the thin film transistor, the active layer with uneven and non-flat surfaces has a larger heat dissipation area, which effectively avoids a reduction of electron mobility and a weakening of the driving force caused by thermal deformation, avoids a positive shift of a photo bias temperature stress (PBTPS) curve (C-V curve), keeps stability of characteristics of the TFT, and effectively improves uniformity of the active layer. On the other hand, because the active layer has the uneven and non-flat surfaces, the TFT occupies a smaller area, further improves the pixel aperture ratio, and realizes manufacture of the display device with a high pixels per inch (PPI).

A change law of potential of a top channel and a change law of potential of a bottom channel of the oxide semiconductor TFT are same, that is, the potential gradually increases from a source end to a drain end, a value of the potential increases sharply near the drain end, and the value of the potential reaches a maximum at the drain end and remains unchanged, this is because an equivalent impedance of a "pinch-off region" near the drain end is larger than that of the channel region. Therefore, a drain-source voltage Vds is mainly applied to the "pinch-off region" near the drain end. The sharp increase of voltage near the drain end also indicates that an electric field intensity in the "pinch-off region" near the drain end is relatively high.

As illustrated in FIG. 1, a portion of the active layer 103 between the source electrode 104a and the drain electrode 104B is a channel portion (i e channel region), a portion of the active layer 103 directly below the source electrode 104a is a source portion, a portion of the active layer 103 directly below the drain electrode 104b is a drain portion, and the channel portion is between the source portion and the drain portion. The channel portion, the source portion and the drain portion are integral.

As illustrated in FIG. 1, in some embodiments of the present disclosure, the source electrode 104a is in contact with the active layer 103, and the drain electrode 104b is in contact with the active layer 103. For example, the source electrode 104a is in contact with the source portion of the active layer 103, and the drain electrode 104b is in contact with the drain portion of the active layer 103. A first contact interface c1 between the first surface s1 and the source electrode 104a is a non-flat surface, and a second contact interface c2 between the first surface s1 and the drain electrode 104b is a non-flat surface. The first contact interface c1 and the second contact interface c2 are non-flat contact interfaces, which effectively improves a contact area between the source electrode and the active layer as well as a contact area between the drain electrode and the active layer, effectively reduces a contact resistance between a top of the active layer and the source electrode as well as the drain electrode in the "pinch-off region", enhances stability of electron mobility, and optimizes stability of a threshold voltage (Vth) of the active layer (e.g., a metal oxide semiconductor active layer).

As illustrated in FIG. 1, in some embodiments of the present disclosure, the active layer 103 further includes a first side surface ss1 and a second side surface ss2 which are opposite to each other. In order to increase the contact area and reduce the contact resistance, the source electrode 104a is in contact with the first side ss1 and the drain electrode 104b is in contact with the second side ss2. The first surface s1 is connected with both the first side ss1 and the second side ss2.

As illustrated in FIG. 1, in some embodiments of the present disclosure, the first surface s1 includes a plurality of depressions 10. A protrusion 01 is between adjacent depressions 10 of the plurality of depressions 10. One of the depressions 10 is between adjacent protrusions 01. As illustrated in FIG. 1, the first surface s1 includes a plurality of depressions 10 and a plurality of protrusions 01 which are alternately arranged. For example, the plurality of depressions 10 include a first depression 10a and a second depression 10b. In order to increase the contact area and reduce the contact resistance, the source electrode 104a fills the first depression 10a and the drain electrode 104b fills the second depression 10b. Therefore, the contact area between the source-drain electrode layer 104 and the active layer 103 increases and the contact resistance decreases.

In FIG. 1, a total number of the first depression 10a filled by the source electrode 104a is not limited to that illustrated in the figure, and a total number of the second depression 10b filled by the drain electrode 104b is not limited to that illustrated in the figure. The source electrode 104a for example fills a plurality of first depressions 10a and the drain electrode 104b for example fills a plurality of second depressions 10b.

For example, as illustrated in FIG. 1, in order to increase the heat dissipation area, the first surface s1 further includes a third depression 10c which is not filled by the source electrode 104a and drain electrode 104b.

For example, as illustrated in FIG. 1, at least one selected from a group consisting of the first depression 10a, the second depression 10b and the third depression 10c comprises a groove having a rectangular, approximately rectangular, trapezoidal, or approximately trapezoidal cross section.

For oxide semiconductor thin film transistors (TFTs), most of them are devices with bottom gate structure, and some of them adopt top gate structures to obtain better TFT characteristics. However, an insulation layer and electrodes are deposited after the oxide semiconductor film such as IGZO film is deposited; it is required that subsequent manufacture processes of films are performed in vacuum or ion atmosphere, which affects a microstructure of the oxide semiconductor film (such as too small or too large crystal grains, uneven and unreasonable crystal morphology structure between crystal interfaces), which even produces defects, such as ion vacancies and the like. Therefore, for the thin film transistor with the top gate structure, problems of stability and uniformity still exist. For example, a width of a forbidden band of IGZO is about 3.4 eV, and the oxide semiconductor TFT such as IGZO TFT is affected by light emitted from a backlight source and ambient light, thus causing the semiconductor active layer to generate a light leakage current, affecting characteristics of the TFT, and even causing a threshold voltage (Vth) shift of the TFT, and affecting normal operation of the TFT.

Carrier mobility of the oxide semiconductor is high (10-100 $cm^2V^{-1}s^{-1}$), which meets a mobility range required for driving an organic light emitting diode (OLED). Therefore, the oxide semiconductor TFT technology is considered as a pixel driving technology suitable for OLED. However, stability of negative gate voltage stress of the oxide semiconductor TFT under illumination is still insufficient, and it is usually necessary to add a light shielding layer or design a more complex pixel circuit to compensate.

As illustrated in FIG. 1, in some embodiments of the present disclosure, in order to prevent the performance of the thin film transistor from being affected because the active layer is irradiated by light, the thin film transistor further includes a light shielding layer 102, the light shielding layer 102 is at a side, close to the base substrate 101, of the active layer 103, and the light shielding layer 102 is configured to partially reflect or totally reflect light irradiated to the light shielding layer. The light shielding layer 102 effectively shields the light from the backlight source, improves the stability of the active layer, and effectively avoids display abnormality caused by the leakage current caused by the threshold voltage drift of the semiconductor because of irradiation of the light emitted from the backlight source.

As illustrated in FIG. 1, in order to simplify manufacturing processes, an orthographic projection of the light shielding layer 102 on the base substrate 101 coincides with an orthographic projection of the active layer 103 on the base substrate 101.

As illustrated in FIG. 1, in order to simplify the processes, a surface s0, away from the base substrate 101, of the light shielding layer 102 is a non-flat surface so as to facilitate conformal formation of the active layer 103 on the light shielding layer 102. For example, the light shielding layer 102 is made of an insulation material, and the light shielding layer 102 and the active layer 103 are in contact with each other. For example, a third contact interface c3 between the light shielding layer 102 and the active layer 103 is a non-flat surface.

As illustrated in FIG. 1, in order to simplify the processes, the light shielding layer 102 and the active layer 103 are formed by a patterning process, and the light shielding layer 102 has a same pattern as the active layer 103. The light shielding layer 102 includes a third side ss3 and a fourth side ss4 that are opposite to each other, the source electrode 104a is in contact with the third side ss3, and the drain electrode 104b is in contact with the fourth side ss4.

For example, a material of the light shielding layer 102 comprises at least one selected from a group consisting of an insulation metal oxide and a silicon-based composite insulation film. Before the active layer is formed, the light shielding layer made of at least one selected from the group consisting of the insulation metal oxide and the silicon-based composite insulation film is formed, which is beneficial to optimizing a grain size of the active layer, reducing grain defects and improving electron mobility. The light shielding layer 102 for example is a single layer or a structure in which a plurality of layers are stacked. The insulation metal oxide reflects light irradiated on it. For example, the insulation metal oxide is MoOx, CuO or other metal oxides which are easy to be etched by acidic chemical agents. The silicon-based composite insulation film totally reflects light irradiated on it. A refractive index of the silicon-based composite insulation film is adjusted by controlling conditions for forming the film, so that the light irradiating from the backlight source onto the base substrate is totally reflected by the composite film, thereby avoiding influence of the light emitted from the backlight source on the semiconductor active layer.

Figure 2:
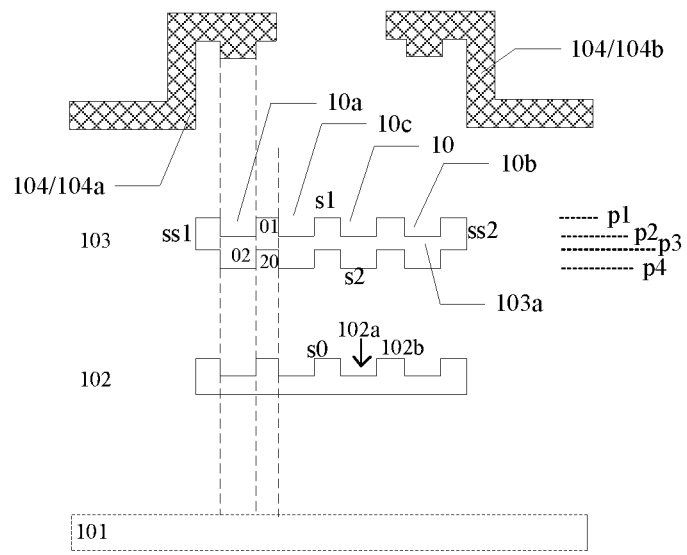
FIG. 2 is an exploded view of the thin film transistor provided by at least one embodiment of the present disclosure.

FIG. 2 is an exploded view of the thin film transistor provided by at least one embodiment of the present disclosure. As illustrated in FIG. 2, the second surface s2 of the active layer 103 includes a plurality of depressions 20 and a plurality of protrusions 02 which are alternately arranged. As illustrated in FIG. 2, orthographic projections of the plurality of depressions 10 on the base substrate 101 respectively coincide with orthographic projections of the plurality of protrusions 02 on the base substrate 101. As illustrated in FIG. 2, the surface s0, away from the base substrate 101, of the light shielding layer 102 includes a plurality of concave portions 102a and a plurality of convex portions 102b. As illustrated in FIG. 2, the orthographic projections of the plurality of depressions 10 on the base substrate 101 respectively coincide with the orthographic projections of the plurality of protrusions 02 on the base substrate 101 and respectively coincide with orthographic projections of the plurality of concave portions 102a on the base substrate 101, and the orthographic projections of the plurality of protrusions 02 on the base substrate 101 respectively coincide with the orthographic projections of the plurality of concave portions 102a on the base substrate 101. As illustrated in FIG. 2, orthographic projections of the plurality of protrusions 01 on the base substrate 101 respectively coincide with orthographic projections of the plurality of depressions 20 on the base substrate 101 and respectively coincide with orthographic projections of the plurality of convex portions 102b on the base substrate 101, and the orthographic projections of the plurality of depressions 20 on the base substrate 101 respectively coincide with the orthographic projections of the plurality of convex portions 102b on the base substrate 101.

For example, as illustrated in FIG. 2, surfaces, away from the base substrate 101, of the plurality of protrusions 01 are located in a same plane p1. Surfaces, close to the base substrate 101, of the plurality of depressions 10 (the first depression 10a, the second depression 10b and the third depression 10c) are located in a same plane p2. Surfaces, away from the base substrate 101, of the plurality of depressions 20 are located in a same plane p3. Surfaces, close to the base substrate 101, of the plurality of protrusions 02 are located in a same plane p4. For example, as illustrated in FIG. 1 and FIG. 2, surfaces, close to the base substrate 101, of the plurality of concave portions 102a are located in the same plane p4. Surfaces, away from the base substrate 101, of the plurality of convex portions 102b are located in the same plane p3.

As illustrated in FIG. 2, in order to improve properties of the active layer, the active layer has a main body 103a extending in a direction from the source electrode to the drain electrode, the plurality of protrusions 01 of the first surface s1 are disposed at one side of the main body 103a, and the plurality of protrusions 02 of the second surface s2 are disposed on the other side of the main body 103a. The plurality of protrusions 01, the plurality of protrusions 02 and the main body 103a are integral.

Figure 3:
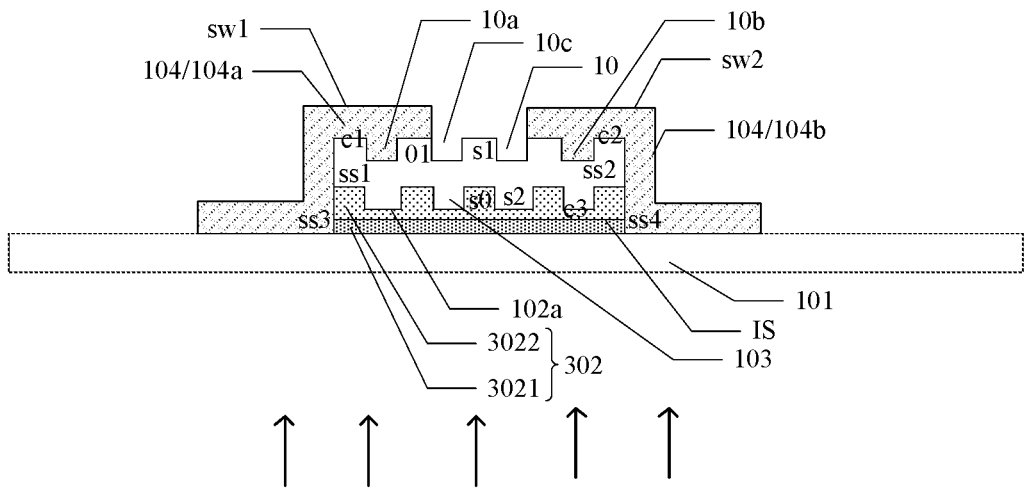
FIG. 3 is another cross-sectional view of the thin film transistor provided by at least one embodiment of the present disclosure.

FIG. 3 is another cross-sectional view of the thin film transistor provided by at least one embodiment of the present disclosure. As illustrated in FIG. 3, the thin film transistor includes a light shielding layer 302, and the light shielding layer 302 is a silicon-based composite insulation film. The silicon-based composite insulation film includes a first layer 3021 and a second layer 3022. The first layer 3021 is closer to the base substrate 101 than the second layer 3022. A refractive index of the first layer 3021 is larger than that of the second layer 3022 to facilitate the total reflection. For example, the first layer 3021 is a silicon nitride layer and the second layer 3022 is an amorphous silicon layer. As illustrated in FIG. 3, in this case, the light from the backlight source is incident from a side opposite to a side, where the thin film transistor is disposed, of the base substrate 101. In order to simplify the processes, the silicon-based composite insulation film is formed by a same patterning process. As illustrated in FIG. 3, the plurality of convex portions and the plurality of concave portions of the surface s0, away from of the base substrate 101, of the light shielding layer 302 are all formed in the second layer 3022. In order to facilitate the total reflection, as illustrated in FIG. 3, a material of the second layer 3022 is filled between an interface IS which is between the first layer 3021 and the second layer 3022, and the plurality of concave portions 102a. That is, the second layer 3022 has a body portion extending along the direction from the source electrode 104a to the drain electrode 104b. That is, during forming the plurality of concave portions 102a, the plurality of concave portions 102a are formed in the second layer 3022 away from the base substrate 101, and the plurality of concave portions 102a do not penetrate through the second layer 3022.

Figure 4:
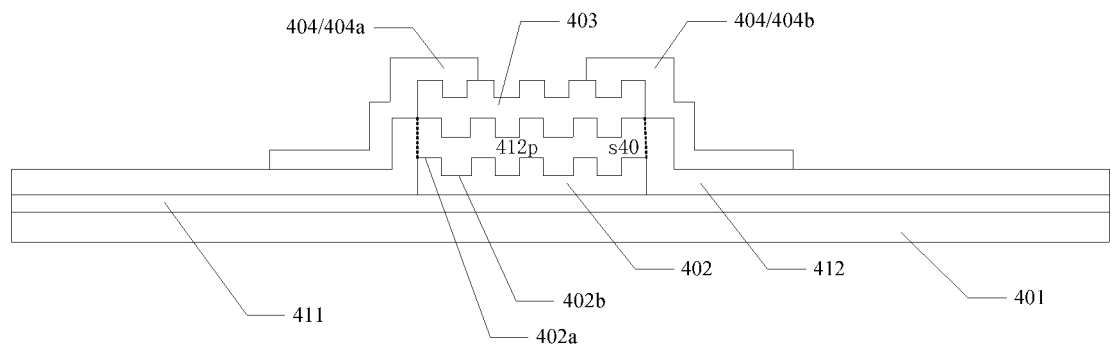
FIG. 4 is further another cross-sectional view of the thin film transistor provided by at least one embodiment of the present disclosure.

FIG. 4 is further another cross-sectional view of the thin film transistor provided by at least one embodiment of the present disclosure. As illustrated in FIG. 4, a buffer layer 411, a light shielding layer 402, a gate insulation layer 412, an active layer 403 and a source-drain electrode layer 404 are sequentially provided on a base substrate 401. The source-drain electrode layer 404 includes a source electrode 404a and a drain electrode 404b which are separated from each other. For example, the light shielding layer 402 is conductive, and the light shielding layer 402 further serves as a gate electrode of the thin film transistor. For example, the light shielding layer 402 is made of conductive metal or alloy. For example, a material of the light shielding layer 402 includes a metal or an alloy of at least one selected from a group consisting of molybdenum (Mo), aluminum (Al), copper (Cu), and titanium (Ti).

As illustrated in FIG. 4, the gate insulation layer 412 is provided between the light shielding layer 402 and the active layer 403, and a portion 412p, directly over the light shielding layer 402, of the gate insulation layer 412 is conformally formed on the light shielding layer 402, so that the portion, directly over the light shielding layer 402, of the gate insulation layer 412 also has two uneven surfaces opposite to each other, resulting in that the active layer 403 has two uneven surfaces opposite to each other. The descriptions of the source-drain electrode layer 404 and the active layer 403 in the thin film transistor illustrated in FIG. 4 may be referred to the descriptions of the source-drain electrode layer 104 and the active layer 103 in the thin film transistor illustrated in FIG. 1, and are not repeated here.

The above description is based on the example that the depression includes a groove with a rectangular or approximately rectangular cross section. However, in the embodiments of the present disclosure, other forms of depressions may be adopted.

Figure 5:
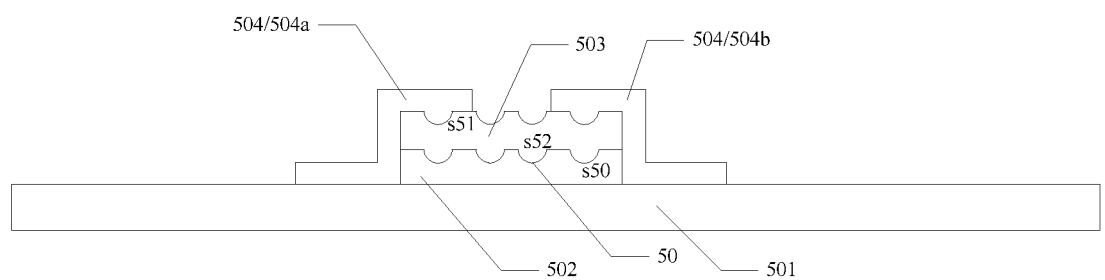
FIG. 5 is still another cross-sectional view of the thin film transistor provided by at least one embodiment of the present disclosure.

FIG. 5 is still another cross-sectional view of the thin film transistor according to at least one embodiment of the present disclosure. As illustrated in FIG. 5, a light shielding layer 502, an active layer 503 and a source-drain electrode layer 504 are sequentially provided on a base substrate 501. The source-drain electrode layer 504 includes a source electrode 504a and a drain electrode 504b. A first surface s50, away from the base substrate 501, of the light shielding layer 502 is a non-flat surface and has a concave-convex structure. The active layer 503 includes a first surface s51 away from the base substrate 501 and a second surface s52 close to the base substrate 501. Compared with the structure of the thin film transistor illustrated in FIG. 1, cross sections of depressions of the surface s50, the first surface s51 and the second surface s52 in this embodiment are all arc-shaped. In the embodiments of the present disclosure, the cross sections of the depressions of the uneven surfaces may be adjusted according to actual needs or manufacture processes, and no limitation is imposed to this. For example, the cross sections of the depressions include a shape of at least one selected from a group consisting of arc, sawtooth, wave, and zigzag.

In the embodiments of the present disclosure, the description is made by taking a case that a surface sw1 of the source electrode and a surface sw2 (see FIG. 3) of the drain electrode which are furthest away from the base substrate are flat planes as an example. However, the embodiments of the disclosure are not limited to this. For example, the surface sw1 of the source electrode and the surface sw2 of the drain electrode which are furthest away from the base substrate are non-flat surfaces. For example, as illustrated in FIG. 3, an orthographic projection of a portion of the source electrode 104a on the base substrate 101 overlaps with an orthographic projection of the active layer 103 on the base substrate 101, and a surface, away from the base substrate 101, of this portion of the source electrode 104a is a flat surface; however, the embodiments of the disclosure are not limited to this, and the surface, away from the base substrate 101, of this portion of the source electrode 104a may be a non-flat surface. For example, as illustrated in FIG. 3, an orthographic projection of a portion of the drain electrode 104b on the base substrate 101 overlaps with the orthographic projection of the active layer 103 on the base substrate 101, and a surface, away from the base substrate 101, of this portion of the drain electrode 104b is a flat surface; however, the embodiments of the disclosure are not limited to this, and the surface, away from the base substrate 101, of this portion of the drain electrode 104b may be a non-flat surface.

According to positions of the gate electrode and the active layer, the thin film transistors are divided into bottom gate structure and top gate structure. In the bottom gate structure, the gate electrode is closer to the base substrate than the active layer. In the top gate structure, the active layer is closer to the base substrate than the gate electrode. According to contact modes of the source-drain electrode layer with the active layer, the thin film transistors are divided into a top contact structure and a bottom contact structure. In the top contact structure, the active layer is closer to the base substrate than the source-drain electrode layer. In the bottom contact structure, the source-drain electrode layer is closer to the base substrate than the active layer. The thin film transistor in the embodiments of the present disclosure may be the bottom gate structure or the top gate structure. In addition, the thin film transistor in the embodiments of the present disclosure may be the top contact structure or the bottom contact structure. The thin film transistor with the bottom gate and top contact structure is illustrated in FIG. 4. The gate electrode is not illustrated in FIG. 1-FIG. 3. The thin film transistor illustrated in FIG. 1-FIG. 3 may be arranged into the top gate structure or the bottom gate structure as required.

Figure 6:
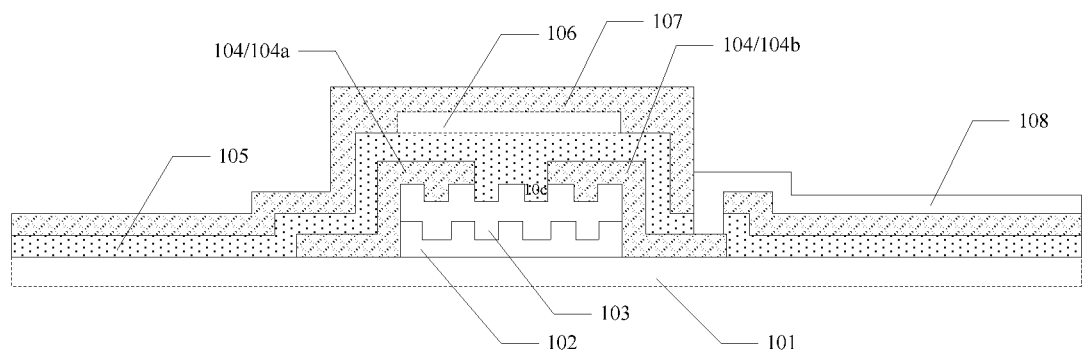
FIG. 6 is a cross-sectional view of the thin film transistor and an array substrate including the thin film transistor which are provided by at least one embodiment of the present disclosure.

FIG. 6 is a cross-sectional view of the thin film transistor and an array substrate including the thin film transistor which are provided by at least one embodiment of the present disclosure. As illustrated in FIG. 6, the thin film transistor further includes a first insulation layer 105 at a side, away from the base substrate 101, of the source-drain electrode layer 104, and the third depression 10c is filled with the first insulation layer 105. As illustrated in FIG. 6, the thin film transistor further includes a gate electrode 106. The gate electrode 106 for example is made of metal or alloy. For example, a material of the gate electrode 106 includes a metal or an alloy of at least one selected from a group consisting of molybdenum (Mo), aluminum (Al), copper (Cu), and titanium (Ti), but is not limited thereto. The gate electrode 106 is located at the side, away from the active layer 103, of the source-drain electrode layer 104. The gate electrode 106 and the source electrode 104a are insulated from each other, and the gate electrode 106 and the drain electrode 104b are insulated from each other. As illustrated in FIG. 6, the thin film transistor is of the top gate structure, and the TFT with the top gate structure effectively avoids influence of ambient light or light emitted from the organic light emitting layer and ensures the stability of the active layer. In a case where the TFT adopts the bottom gate structure, a black matrix located above the TFT is used to block light.

In the thin film transistor, the gate electrode is configured to be input with a gate signal and the source electrode is configured to be input with a data signal. For example, if the gate signal larger than the threshold voltage of the thin film transistor is input to the gate electrode, the thin film transistor is turned on, and the data signal reaches the drain electrode from the source electrode through the active layer. In the embodiments of the present disclosure, the thin film transistor includes the gate electrode, the gate insulation layer, the active layer, the source electrode and the drain electrode, but the embodiments of the disclosure are not limited to thereto.

In the embodiments of the present disclosure, the initial uneven surface is the uneven surface of the light shielding layer or the gate electrode, and then the active layer is conformally formed on the initial uneven surface. In the embodiments of the present disclosure, the initial uneven surface is the uneven surface of the insulation layer, and then the active layer is conformally formed on the initial uneven surface.

In the embodiments of the present disclosure, the structure of the initial uneven surface for example comprises a plurality of sub-structures separated from each other, the plurality of sub-structures separated from each other are a plurality of convex portions, and concave portions are formed between adjacent sub-structures. For example, the plurality of sub-structures are parallel to each other.

As illustrated in FIG. 6, the array substrate includes a second insulation layer 107 and a pixel electrode 108 in addition to the thin film transistor. The pixel electrode 108 is electrically connected to the drain electrode 104b through a via hole penetrating the first insulation layer 105 and the second insulation layer 107. If the thin film transistor is turned on, the data signal reaches the pixel electrode through the thin film transistor. The pixel electrode 108 for example is made of a transparent conductive material. For example, a material of the pixel electrode 108 includes, but is not limited to, indium tin oxide (ITO).

Figure 7:
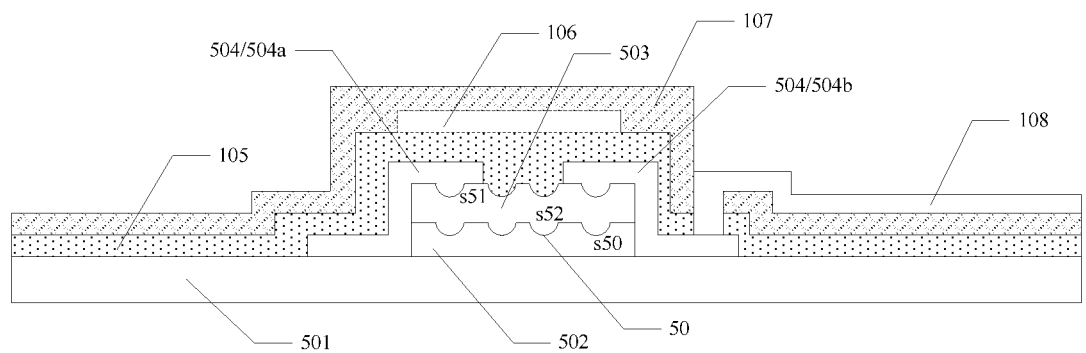
FIG. 7 is another cross-sectional view of the thin film transistor and the array substrate including the thin film transistor which are provided by at least one embodiment of the present disclosure.

FIG. 7 is another cross-sectional view of the thin film transistor and the array substrate including the thin film transistor which are provided by at least one embodiment of the present disclosure. Compared with the structure illustrated in FIG. 6, the shape of the cross section of the depression is changed.

Figure 8:
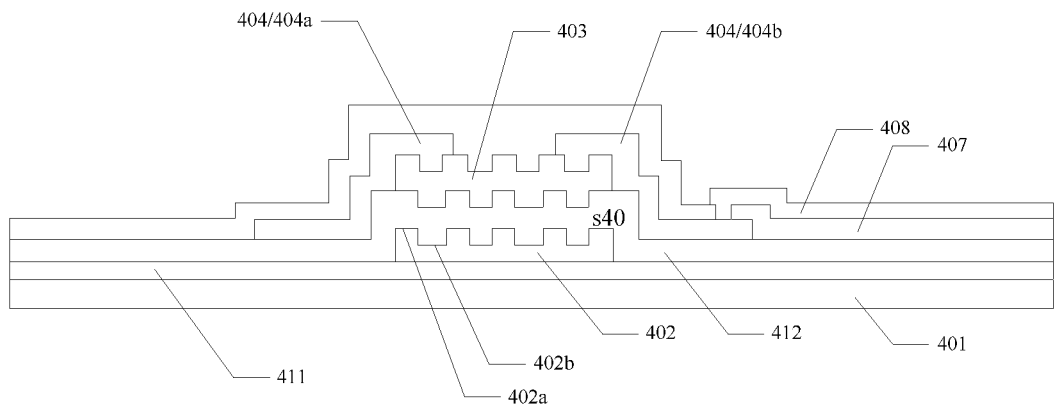
FIG. 8 is further another cross-sectional view of the thin film transistor and the array substrate including the thin film transistor which are provided by one embodiment of the present disclosure.

FIG. 8 is further another cross-sectional view of the thin film transistor and the array substrate including the thin film transistor which are provided by at least one embodiment of the present disclosure. The light shielding layer 402 further serves as the gate electrode of the thin film transistor. For example, as illustrated in FIG. 8, an insulation layer 407 is provided at a side, away from the base substrate, of the source-drain electrode layer 404 of the array substrate, and the pixel electrode 408 is electrically connected to the drain electrode 404b through a via hole penetrating through the insulation layer 407.

At least one embodiment of the present disclosure further provides a display device including any of the above array substrates. For example, the display device includes a liquid crystal display device or an OLED display device, but the embodiments of the disclosure are not limited thereto.

At least one embodiment of the present disclosure further provides a manufacturing method of the thin film transistor, the thin film transistor is formed on a base substrate, and the method comprises:

forming an active layer comprising a first surface and a second surface which are opposite to each other, in which the second surface is closer to the base substrate than the first surface, each of the first surface and the second surface is non-flat surface, and the non-flat surface comprises a plurality of depressions and a plurality of protrusions which are alternately arranged; and forming a source-drain electrode layer comprising a source electrode and a drain electrode which are separated from each other and are respectively connected with the active layer.

For example, the method further comprises: before forming the active layer, forming a light shielding layer on the base substrate, in which a surface, away from the base substrate, of the light shielding layer comprises a plurality of concave portions and a plurality of convex portions which are alternately arranged, and the active layer is conformally formed on the light shielding layer. For example, the light shielding layer is formed by one mask process. In a case where the light shielding layer is formed by stacking a plurality of layers, the light shielding layer for example is also formed by one mask process.

FIG. 9A-FIG. 9H illustrate the manufacturing method of the thin film transistor provided by at least one embodiment of the present disclosure. The method is described in detail below with reference to FIG. 9A-FIG. 9H.

For example, the forming the light shielding layer and the forming the active layer include the following steps.

Figure 9A:
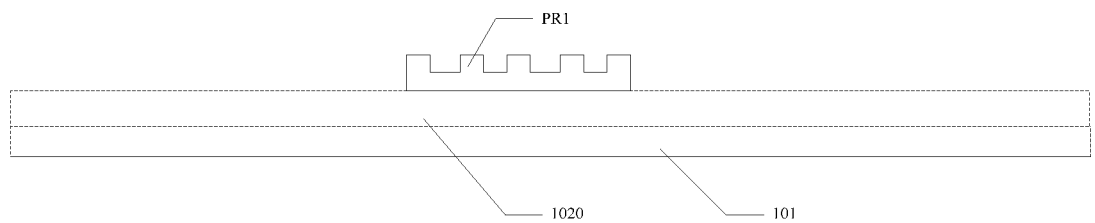
FIG. 9A-FIG. 9H illustrate a manufacturing method of the thin film transistor provided by at least one embodiment of the present disclosure.

As illustrated in FIG. 9A, a light shielding film 1020 is formed on the base substrate 101, and a photoresist pattern PR1 having two portions of different thicknesses is formed on the light shielding film 1020.

Figure 9B:
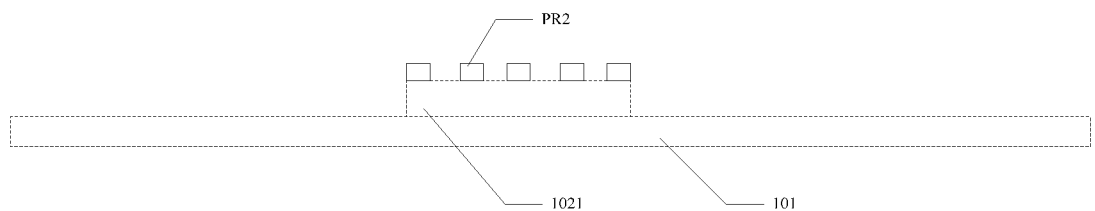

As illustrated in FIG. 9B, by using the photoresist pattern PR1 as a mask, the light shielding film 1020 is patterned to form a light shielding intermediate layer 1021, and then the photoresist pattern PR1 is ashed to remove the portion of the photoresist with a smaller thickness to form a photoresist pattern PR2.

Figure 9C:
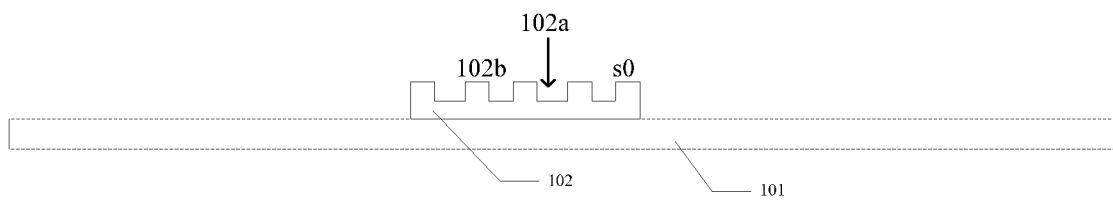

As illustrated in FIG. 9C, by using the photoresist pattern PR2 as a mask, the light shielding intermediate layer 1021 is etched to form the light shielding layer 102. The surface s0, away from the base substrate 101, of the light shielding layer 102 includes a plurality of concave portions 102a and a plurality of convex portions 102b, and then the photoresist pattern PR2 is removed. The etching described above for example is dry etching, but the embodiments of the disclosure are not limited thereto.

Figure 9D:
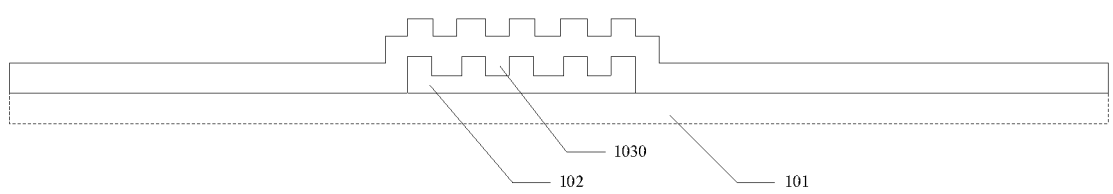

As illustrated in FIG. 9D, an active film 1030 is conformally formed on the light shielding layer 102.

Figure 9E:
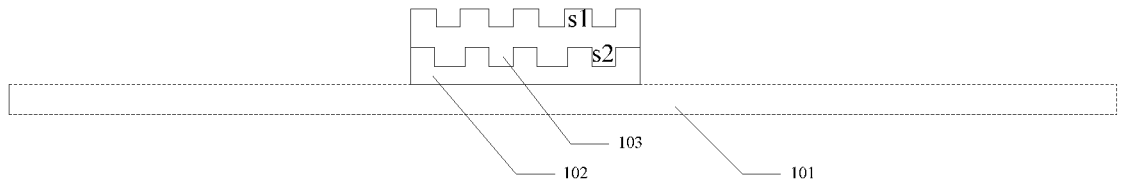

As illustrated in FIG. 9E, the active film 1030 is patterned to form the active layer 103. The first surface s1 and the second surface s2 of the active layer 103 are illustrated in FIG. 9E.

Figure 9F:
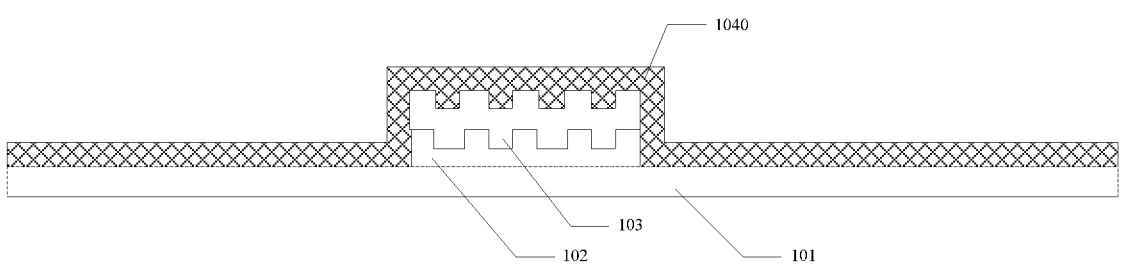

As illustrated in FIG. 9F, a source-drain electrode film 1040 is formed on the active layer 103.

Figure 9G:
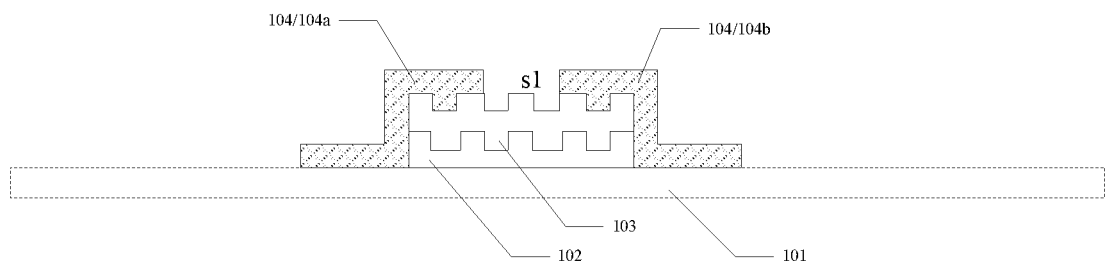

As illustrated in FIG. 9G, the source-drain electrode film 1040 is patterned to form the source-drain electrode layer 104 including the source electrode 104a and the drain electrode 104b which are separated from each other. The source electrode 104a and the drain electrode 104b are respectively in contact with the first surface s1.

Figure 9H:
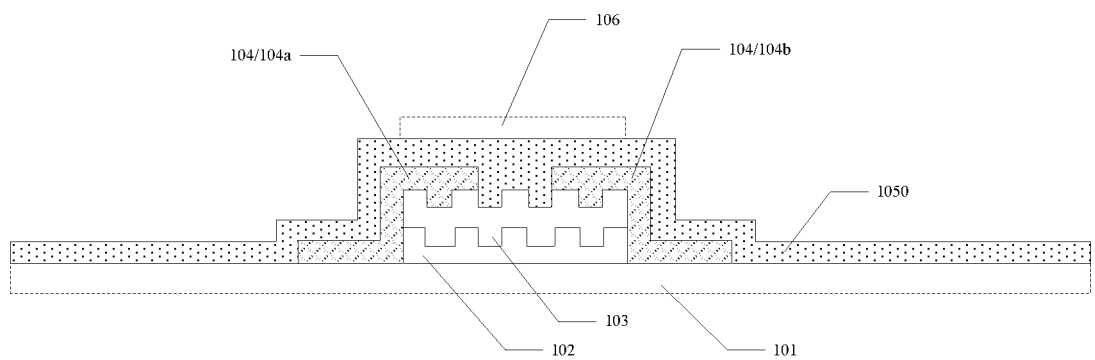

As illustrated in FIG. 9H, a first insulation film 1050 is formed on the source-drain electrode layer 104, and a gate electrode 106 is formed on the first insulation film 1050. The gate electrode 106 for example is formed by forming a gate electrode film and then patterning the gate electrode film.

Figure 10A:
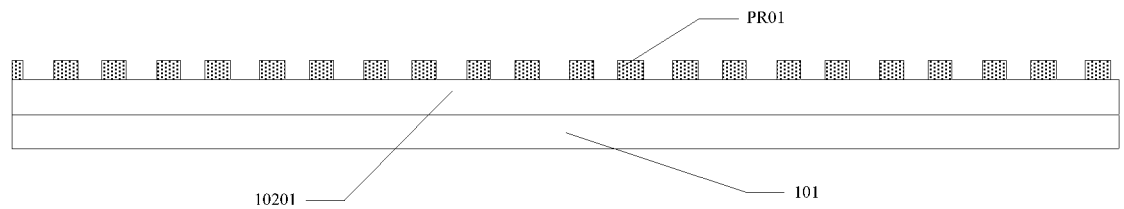
FIG. 10A-FIG. 10C illustrate another manufacturing method of a light shielding layer and an active layer the in thin film transistor provided by at least one embodiment of the present disclosure.
Figure 10B:
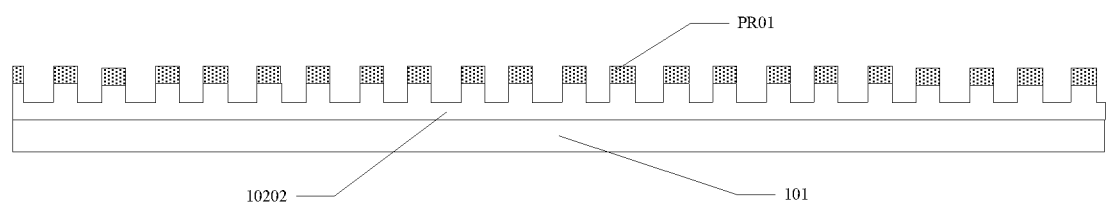
Figure 10C:
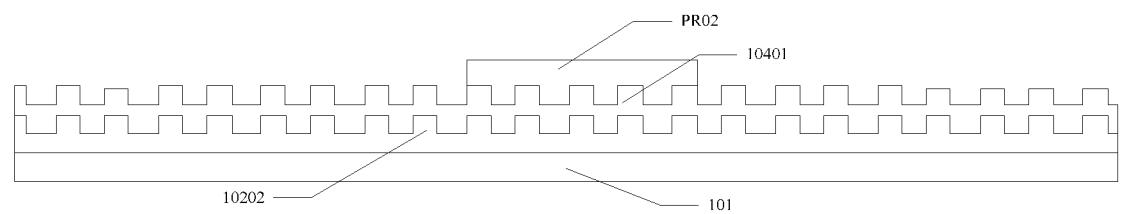

FIG. 10A-FIG. 10C illustrate another manufacturing method of the light shielding layer and the active layer in the thin film transistor provided by at least one embodiment of the present disclosure. The method is described in detail below with reference to FIG. 10A-FIG. 10C.

The forming the light shielding layer and the forming the active layer include the following steps.

As illustrated in FIG. 10A, a first light shielding film 10201 is formed on the base substrate 101, and a photoresist pattern PR01 is formed on the light shielding film 10201.

As illustrated in FIG. 10B, the first light shielding film 10201 is patterned to remove portions of the first light shielding film 10201 at intervals to form a second light shielding film 10202 and then the photoresist pattern PR01 is removed.

As illustrated in FIG. 10C, an active film 10401 is conformally formed on the second light shielding film 10202, and a photoresist pattern PR02 is formed on the active film 10401.

The active film 10401 and the second light shielding film 10202 are patterned by one patterning process to form the light shielding layer 102 and the active layer 103 which have a same pattern.

In the manufacturing method of the thin film transistor illustrated in FIG. 10A-FIG. 10C, the manufacturing of the light shielding layer and the active layer is simpler.

At least one embodiment of the present disclosure further provides a manufacturing method of an array substrate, including any one of the above manufacturing methods of the thin film transistor.

Figure 11A:
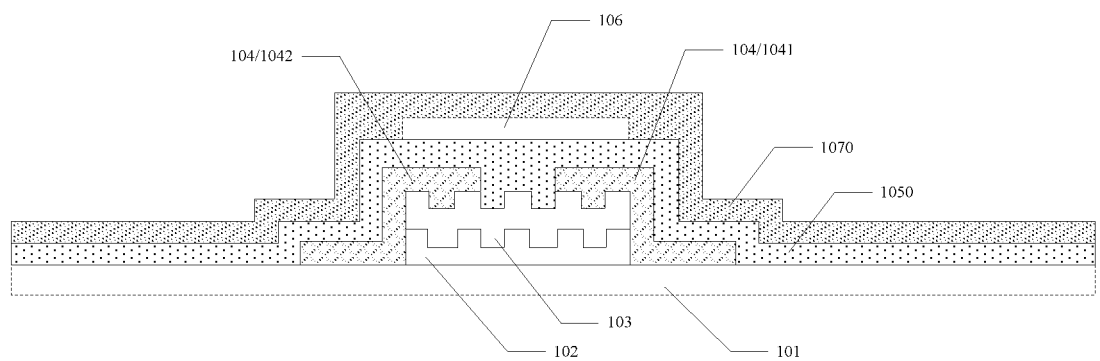
FIG. 11A-FIG. 11B illustrate a manufacturing method of an array substrate provided by at least one embodiment of the present disclosure.
Figure 11B:
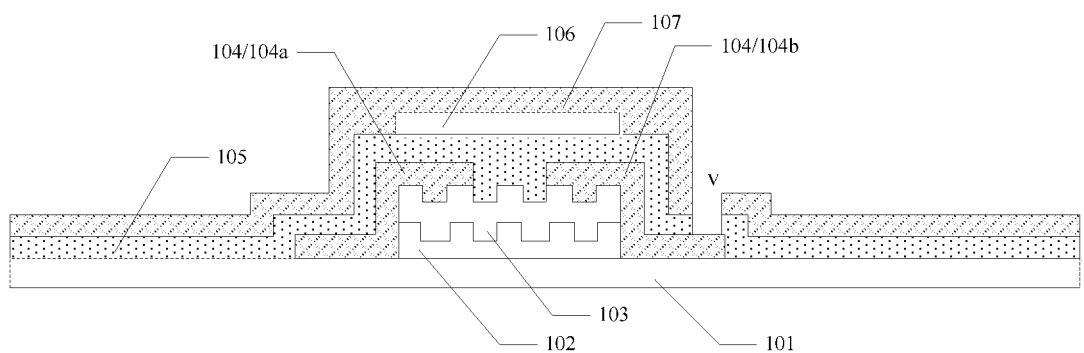

FIG. 11A-FIG. 11B illustrate the manufacturing method of the array substrate provided by at least one embodiment of the present disclosure. The manufacturing method of the array substrate for example is performed on the basis of the structure illustrated in FIG. 9H. The manufacturing method of the array substrate includes the following steps.

As illustrated in FIG. 11A, a second insulation film 1070 is formed on the gate electrode 106.

As illustrated in FIG. 11B, a via hole v is formed in the first insulation film 1050 and the second insulation film 1070 to expose the drain electrode 104b.

A pixel electrode 108 is formed, and the pixel electrode 108 is connected to the drain electrode 104b. The structure of the formed array substrate is illustrated in FIG. 6.

The pixel electrode for example is formed by forming a pixel electrode film and then patterning the pixel electrode film.

For example, in a case where the light shielding layer is conductive, a wet etching method is used to form the uneven surface of the light shielding layer.

In the embodiments of the present disclosure, the gate insulation layer, the first insulation layer, the second insulation layer, etc. may be made of insulation materials. For example, materials of the gate insulation layer, the first insulation layer and the second insulation layer include at least one selected from a group consisting of silicon oxide, silicon nitride, silicon oxynitride, etc., but the embodiments of the disclosure are not limited to thereto.

In the embodiments of the present disclosure, the source electrode and the drain electrode are conductive; for example, the source electrode and the drain electrode are a single-layer structure or a multi-layer structure which are made of a metal material or an alloy material. In the embodiments of the present disclosure, the gate electrode is conductive; for example, the gate electrode is a single-layer structure or a multi-layer structure which are made of a metal material or an alloy material.

In the embodiments of the present disclosure, the technical solutions are described by taking the thin film transistor illustrated in FIG. 1 and the array substrate illustrated in FIG. 6 as examples. The thin film transistor and the array substrate of other structures provided by the embodiments of the present disclosure may be fabricated with reference to these examples and are not repeated here.

It should be noted that, in order to be clear, thicknesses of layers or regions are amplified in the drawings for describing the embodiments of the present disclosure. It should be understood that when an element such as a layer, film, region or substrate is referred to as being "on" or "under" another element, the element may be "directly" on "or" under "the another element, or intervening elements may exist.

In the embodiment of the present disclosure, the patterning or the patterning process may include only a photolithography process, or may include a photolithography process and an etching step, or may include printing, inkjet, or other processes for forming a predetermined pattern. The photolithography process refers to a process including film formation, exposure, development, etc. so as to form patterns using photoresist, mask plate, exposure machine, etc. The corresponding patterning process may be selected according to the structure formed in the embodiments of the present disclosure.

In the embodiments of the present disclosure, the source electrode and the drain electrode are relative, and may be exchanged according to needs in actual use.

Without conflict, features in the same embodiment and different embodiments of the present disclosure may be combined with each other.

The above descriptions are only specific embodiments of the present disclosure, but the scope of protection of the present disclosure is not limited to this. Changes or substitutions which can be easily obtained by any ordinary person familiar with the technical field within the technical scope of the present disclosure should be covered within the protection scope of the present disclosure. Therefore, the scope of protection of the present disclosure should be based on the protection scope of the claims.

What is claimed is:

1. A thin film transistor provided on a base substrate, comprising:

an active layer comprising a first surface and a second surface which are opposite to each other, wherein the second surface is closer to the base substrate than the first surface; and a source-drain electrode layer comprising a source electrode and a drain electrode which are separated from each other and are respectively connected with the active layer, wherein each of the first surface and the second surface is a non-flat surface, and the non-flat surface comprises a plurality of depressions and a plurality of protrusions which are alternately arranged, wherein the thin film transistor further comprises a first insulation layer at a side, away from the base substrate, of the source-drain electrode layer, the plurality of depressions of the first surface further comprise a third depression, and the third depression is filled with the first insulation layer, and wherein the thin film transistor further comprises a light shielding layer; the light shielding layer is at a side, close to the base substrate, of the active layer; the light shielding layer is configured to partially reflect or totally reflect light irradiated to the light shielding layer; and a surface, away from the base substrate, of the light shielding layer comprises a plurality of concave portions and a plurality of convex portions which are alternately arranged, wherein the thin film transistor further comprises the plurality of depressions of the first surface comprise a first depression and a second depression, the source electrode fills the first depression, and the drain electrode fills the second depression.

2. The thin film transistor according to claim 1, wherein surfaces, close to the base substrate, of the plurality of depressions of the first surface are in a same plane; and surfaces, away from the base substrate, of the plurality of protrusions of the first surface are in a same plane.

3. The thin film transistor according to claim 1, wherein the source-drain electrode layer is at a side, away from the base substrate, of the active layer, and the source electrode and the drain electrode are respectively in contact with the first surface.

4. The thin film transistor according to claim 3, wherein the active layer further comprises a first side surface and a second side surface which are opposite to each other, the source electrode is in contact with the first side surface, the drain electrode is in contact with the second side surface, and the first surface is connected with each of the first side surface and the second side surface.

5. The thin film transistor according to claim 1, wherein at least one selected from a group consisting of the first depression, the second depression and the third depression comprises a groove having a rectangular, approximately rectangular, trapezoidal, or approximately trapezoidal cross section.

6. The thin film transistor according to claim 1, wherein orthographic projections of the plurality of depressions of the first surface on the base substrate respectively coincide with orthographic projections of the plurality of concave portions on the base substrate.

7. The thin film transistor according to claim 1, wherein orthographic projections of the plurality of protrusions of the first surface on the base substrate respectively coincide with orthographic projections of the plurality of convex portions on the base substrate.

8. The thin film transistor according to claim 1, wherein the light shielding layer is made of an insulation material, and the light shielding layer is in contact with the active layer.

9. The thin film transistor according to claim 8, wherein the light shielding layer comprises a third side surface and a fourth side surface which are opposite to each other, the source electrode is in contact with the third side surface, and the drain electrode is in contact with the fourth side surface.

10. The thin film transistor according to claim 8, wherein a material of the light shielding layer comprises at least one selected from a group consisting of an insulation metal oxide and a silicon-based composite insulation film.

11. The thin film transistor according to claim 1, further comprising a gate electrode, wherein
the gate electrode is at a side, away from the active layer, of the source-drain electrode layer; and
the gate electrode and the source electrode are insulated from each other, and the gate electrode and the drain electrode are insulated from each other.

12. The thin film transistor according to claim 8, wherein the light shielding layer is conductive, the light shielding layer further serves as a gate electrode of the thin film transistor, a gate insulation layer is between the light shielding layer and the active layer, and a portion, directly over the light shielding layer, of the gate insulation layer is conformal with the light shielding layer.

13. A manufacturing method of a thin film transistor, wherein the thin film transistor is formed on a base substrate, and the method comprises:
forming an active layer comprising a first surface and a second surface which are opposite to each other, wherein the second surface is closer to the base substrate than the first surface, each of the first surface and the second surface is a non-flat surface, and the non-flat surface comprises a plurality of depressions and a plurality of protrusions which are alternately arranged; and
forming a source-drain electrode layer comprising a source electrode and a drain electrode which are separated from each other and are respectively connected with the active layer,
wherein the method further comprises: forming a light shielding layer on the base substrate before forming the active layer, wherein a surface, away from the base substrate, of the light shielding layer comprises a plurality of concave portions and a plurality of convex portions which are alternately arranged, and the active layer is conformally formed on the light shielding layer;
wherein the forming the light shielding layer and the forming the active layer comprise:
forming a first light shielding film on the base substrate;
patterning the first light shielding film to remove portions of the first light shielding film at intervals to form a second light shielding film;
conformally forming an active film on the second light shielding film; and
patterning the active film and the second light shielding film by one patterning process to form the light shielding layer and the active layer which have a same pattern.

14. The method according to claim 13, wherein the source-drain electrode layer is formed at a side, away from the base substrate, of the active layer; and the source electrode and the drain electrode are respectively in contact with the first surface.

* * * * *